United States Patent
Li

(10) Patent No.: US 9,947,842 B2
(45) Date of Patent: Apr. 17, 2018

(54) MANUFACTURING METHOD FOR QUANTUM DOT COLOR FILM SUBSTRATE AND QUANTUM DOT COLOR FILM SUBSTRATE

(71) Applicant: Shenzhen China Star Optoelectronics Technology Co., Ltd., Shenzhen (CN)

(72) Inventor: Dongze Li, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 130 days.

(21) Appl. No.: 14/914,648

(22) PCT Filed: Dec. 28, 2015

(86) PCT No.: PCT/CN2015/099107
§ 371 (c)(1),
(2) Date: Feb. 26, 2016

(87) PCT Pub. No.: WO2017/080064
PCT Pub. Date: May 18, 2017

(65) Prior Publication Data
US 2017/0256686 A1    Sep. 7, 2017

(30) Foreign Application Priority Data
Nov. 13, 2015 (CN) .......................... 2015 1 0779411

(51) Int. Cl.
*H01L 21/00* (2006.01)
*H01L 33/50* (2010.01)
(Continued)

(52) U.S. Cl.
CPC ............ *H01L 33/507* (2013.01); *H01L 33/44* (2013.01); *H01L 33/502* (2013.01); *H01L 33/56* (2013.01);
(Continued)

(58) Field of Classification Search
CPC ....................................................... H01L 21/00
See application file for complete search history.

(56) References Cited

U.S. PATENT DOCUMENTS

| | | | | |
|---|---|---|---|---|
| 2009/0002806 A1* | 1/2009 | Skipor | ................. | G02B 26/005 359/296 |
| 2012/0320607 A1* | 12/2012 | Kinomoto | ............. | H01L 27/322 362/351 |

(Continued)

*Primary Examiner* — Marvin Payen
(74) *Attorney, Agent, or Firm* — Leong C. Lei

(57) ABSTRACT

The present disclosure provides a method for manufacturing quantum dot color film substrate and quantum dot color film substrate. The method is to form a quantum dot adhesive by mixing a red quantum dot material, a green quantum dot material and a photoinitiator in a thermosetting adhesive. The photoinitiator itself does not destroy fluorescence properties of quantum dot, but the photoinitiator is cleaved and can quenching the fluorescence of quantum dot after UV irradiation. A selective quenching quantum dot layer is obtained after coating a quantum dot adhesive uniformly on a color filter layer, and the light mask is used to irradiate the quantum dot adhesive on the blue sub-pixel region. Free radicals are generated by cleaving photoinitiator and are quenching the quantum dot material directly; the method is capable of meeting requirement of high gamut, simple preparation process and low cost.

6 Claims, 2 Drawing Sheets

(51) Int. Cl.
*H01L 33/56* (2010.01)
*H01L 33/44* (2010.01)

(52) U.S. Cl.
CPC .................. *H01L 2933/005* (2013.01); *H01L 2933/0025* (2013.01); *H01L 2933/0041* (2013.01)

(56) References Cited

U.S. PATENT DOCUMENTS

| | | | |
|---|---|---|---|
| 2015/0109560 A1* | 4/2015 | Guo | G02F 1/133617 349/68 |
| 2015/0212352 A1* | 7/2015 | Guo | G02F 1/133617 349/71 |
| 2015/0285444 A1* | 10/2015 | Choi | C09K 11/025 362/84 |

* cited by examiner

MANUFACTURING METHOD FOR QUANTUM DOT COLOR FILM SUBSTRATE AND QUANTUM DOT COLOR FILM SUBSTRATE

FIELD OF THE DISCLOSURE

The present disclosure relates to a display technology field, and more particularly to a method for manufacturing quantum dot color film substrate and a quantum dot color film substrate.

BACKGROUND OF THE DISCLOSURE

With the development of the technology, people on the display device quality requirements are increasingly high. The color gamut of LCD TVs currently on the market can show between 68%-72% NTSC (National Television Standards Committee), and therefore can not provide high-quality color results. In order to improve the performance of the color gamut of LCD TVs, high color gamut backlight technology is becoming the focus of the industry's research traitor.

The bulk semiconductor material decreases to a certain critical size from (I~20 nm), its carrier wave becomes significant, movement will be limited, resulting in increased kinetic energy of the corresponding electron structure from a body The level structure is continuous division into quasi-discontinuous, a phenomenon known as quantum size effect. More common semiconductor quantum dot nanoparticles are mainly I1-VI, II1-V and IV-VI family. These kinds of quantum dots are very observe the quantum size effect, the nature of regular changes with the size of the presentation, such as wavelength absorption and emission varies with the size of the change. Therefore, the semiconductor quantum dots in the areas of lighting, displays, lasers and biological fluorescent labels have very important applications.

Quantum dot material has the advantages of emission spectrum concentrated, high color purity and luminous color is easily adjustable by size, structure or ingredient of the quantum dot material. Its application in the display device is effectively improve gamut and colors reducing ability.

The existing color film substrate of display panel including a plurality of pixel units, and the pixel unit including a red sub-pixel unit, a green sub-pixel unit and a blue sub-pixel unit, wherein the red sub-pixel unit including a red filter to transmit light in red band and filter out light in other bands; the green sub-pixel unit including a green filter to transmit light in green band and filter out light in other bands; the blue sub-pixel unit including a blue filter to transmit light in blue band and filter out light in other bands. For each sub-pixel unit, the filter is transmit small portion of light and filter most of light, such as the red filter transmit light in red band and filter out light in green and blue bands. Therefore the display device has high light loss and low light transmittance.

SUMMARY OF THE DISCLOSURE

The object of the present disclosure to provide a method for manufacturing quantum dot color film substrate, achieving selective quenching of quantum dot material in quantum dot adhesive by photoinitiator, when obtaining high gamut the manufacturing process of quantum dot color film substrate is be simplified to reduce the production cost.

The object of the present disclosure to provide a quantum dot color film substrate capable of meeting requirement of high gamut, simple preparation process and low cost.

To achieve the above object, the present disclosure first provides a method for manufacturing quantum dot color film substrate includes the following steps:

Step 1, providing a substrate, and the substrate including a red sub-pixel region, a green sub-pixel region and a blue sub-pixel region;

Step 2, forming a patterned red colored barrier layer, a patterned green colored barrier layer and a patterned organic transparent photoresist layer on the substrate corresponding to the red sub-pixel region, the green sub-pixel region and the blue sub-pixel region to obtain a color filter layer including a red colored barrier layer, a green colored barrier layer and an organic transparent photoresist layer;

Step 3, coating a quantum dot adhesive on the color filter layer and then heat-curing the quantum dot adhesive;

the quantum dot adhesive is a thermosetting adhesive, including a red quantum dot material, green quantum dot material and a photoinitiator; the photoinitiator is a UV-initiator capable of quenching quantum dot material by UV irradiation;

Step 4, providing a light mask during a heat-curing process, the light mask includes a non-transmitting portion corresponding to the red sub-pixel region and the green sub-pixel region, a transmitting portion corresponding to the blue sub-pixel region; using the light mask to irradiate the quantum dot adhesive on the blue sub-pixel region by using ultraviolet light, the photoinitiator in the quantum dot adhesive on the blue sub-pixel region quenching a quantum dot material by ultraviolet light illumination, but the quantum dot material in the quantum dot adhesive on the red sub-pixel region and the green sub-pixel region not being affected by ultraviolet light illumination;

Step 5, obtaining a selective quenching quantum dot layer after heat-curing; resulting in a color film substrate including a substrate, a color filter and a quantum dot layer; the quantum dot layer including a first quantum dot layer on the red sub-pixel region and the green sub-pixel region and a second quantum dot layer on the blue sub-pixel region;

a red quantum dot material and a green quantum dot material in the first quantum dot layer capable of emitting red and green light under excitation of blue light; a quantum dot material in the second quantum dot layer does not emit light under illumination.

The photoinitiator is benzoin dimethyl ether or benzoyl methyl formate.

In the step 3, thickness of the quantum dot adhesive coated on the color filter layer is 0.5-20 μm.

Further including step 6, a filter layer is formed on the first quantum dot layer to filter out blue light below 400 nm wavelength, for preventing the photoinitiator in the first quantum dot layer quenches the quantum dot material by ultraviolet illumination.

The quantum dot material in the quantum dot adhesive is group II-VI quantum dot material and one or more of group quantum dot material in one or more.

The quantum dot material in the quantum dot adhesive is $ZnCdSe_2$, $CdSe$, $CdTe$, $CuInS_2$ and one or more of $ZnCuInS_3$ in one or more.

The present disclosure further provides a quantum dot color film substrate including a substrate, a color filter layer on the substrate and a quantum dot layer on the color filter layer;

the substrate including a red sub-pixel region, a green sub-pixel region and blue sub-pixel region; the color filter layer including a red colored barrier layer, a green colored barrier layer and an organic transparent photoresist layer corresponding to the red sub-pixel region, the green sub-pixel region and the blue sub-pixel region;

the quantum dot layer including a first quantum dot layer on the red sub-pixel region and the green sub-pixel region and a second quantum dot layer on the blue sub-pixel region; the quantum dot layer is formed by a quantum dot adhesive; the quantum dot adhesive is formed by mixing a red quantum dot material, a green quantum dot material and a photoinitiator in a thermosetting adhesive;

the red quantum dot material and the green quantum dot material in the first quantum dot layer are excited to emitting red light and green light by blue light; the quantum dot material in the second quantum dot layer is fluorescence quenched by the photoinitiator under UV irradiation, the quantum dot material in the second quantum dot layer does not emit light under illumination;

the quantum dot color film substrate is used in a blue backlight display device.

The display device is a liquid crystal display device, an organic light-emitting display device or a quantum dot light emitting display device.

Further including a filter layer on the first quantum dot layer, the filter layer is formed on the first quantum dot layer to filter out blue light below 400 nm wavelength, for preventing the photoinitiator in the first quantum dot layer to quench the quantum dot material by ultraviolet illumination.

Thickness of the quantum dot layer is 0.5-20 µm.

The present disclosure further provides a quantum dot color film substrate, including a substrate, a color filter layer on the substrate and a quantum dot layer on the color filter layer;

the substrate including a red sub-pixel region, a green sub-pixel region and blue sub-pixel region; the color filter layer including a red colored barrier layer, a green colored barrier layer and an organic transparent photoresist layer corresponding to the red sub-pixel region, the green sub-pixel region and the blue sub-pixel region;

the quantum dot layer including a first quantum dot layer on the red sub-pixel region and the green sub-pixel region and a second quantum dot layer on the blue sub-pixel region; the quantum dot layer is formed by a quantum dot adhesive; the quantum dot adhesive is formed by mixing a red quantum dot material, green quantum dot material and photoinitiator in a thermosetting adhesive;

the red quantum dot material and the green quantum dot material in the first quantum dot layer capable of emitting red and green light under excitation of blue light; the quantum dot material in the second quantum dot layer is fluorescence quenched by the photoinitiator under UV illumination, the quantum dot material in the second quantum dot layer does not emit light under illumination;

the quantum dot color film substrate is used in a blue backlight display device;

wherein the display device is a liquid crystal display device, organic light-emitting display device or quantum dot light emitting display device;

further including a filter layer on the first quantum dot layer, the filter layer is formed on the first quantum dot layer to filter out blue light below 400 nm wavelength, for preventing the photoinitiator in the first quantum dot layer on quenching the quantum dot material by ultraviolet;

wherein thickness of the quantum dot layer is 0.5-20 µm.

The present disclosure has the following advantages: the present disclosure provides a method for manufacturing quantum dot color film substrate and quantum dot color film substrate. The method for manufacturing quantum dot color film substrate of the present disclosure is forming a quantum dot adhesive by mixing a red quantum dot material, a green quantum dot material and a photoinitiator in a thermosetting adhesive, the photoinitiator itself is not destroy fluorescence properties of quantum dot, but the photoinitiator is cleaved and can quenching the fluorescence of quantum dot after UV irradiation. Obtaining a selective quenching quantum dot layer after coating a quantum dot adhesive uniformly on a color filter layer, using the light mask to irradiate the quantum dot adhesive on the blue sub-pixel region, free radicals is generated by cleaving a photoinitiator and is quenching the quantum dot material directly; the quantum dot color film substrate by the preparation process capable of meeting requirement of high gamut, simple preparation process and low cost; the quantum dot color film substrate of the present disclosure including a selective quenching quantum dot layer to improve the gamut of display device effectively, simple preparation process and low cost.

BRIEF DESCRIPTION OF THE DRAWINGS

Below in conjunction with the accompanying drawings, the present invention will be described in detail by specific embodiments, the present invention will enable technology and other beneficial effect is obvious.

In the drawings.

DETAILED DESCRIPTION OF PREFERRED EMBODIMENTS

To further illustrate the present invention taken in techniques and their effects, the following in connection with preferred embodiments of the present invention and the accompanying drawings in detail.

Figure 1:
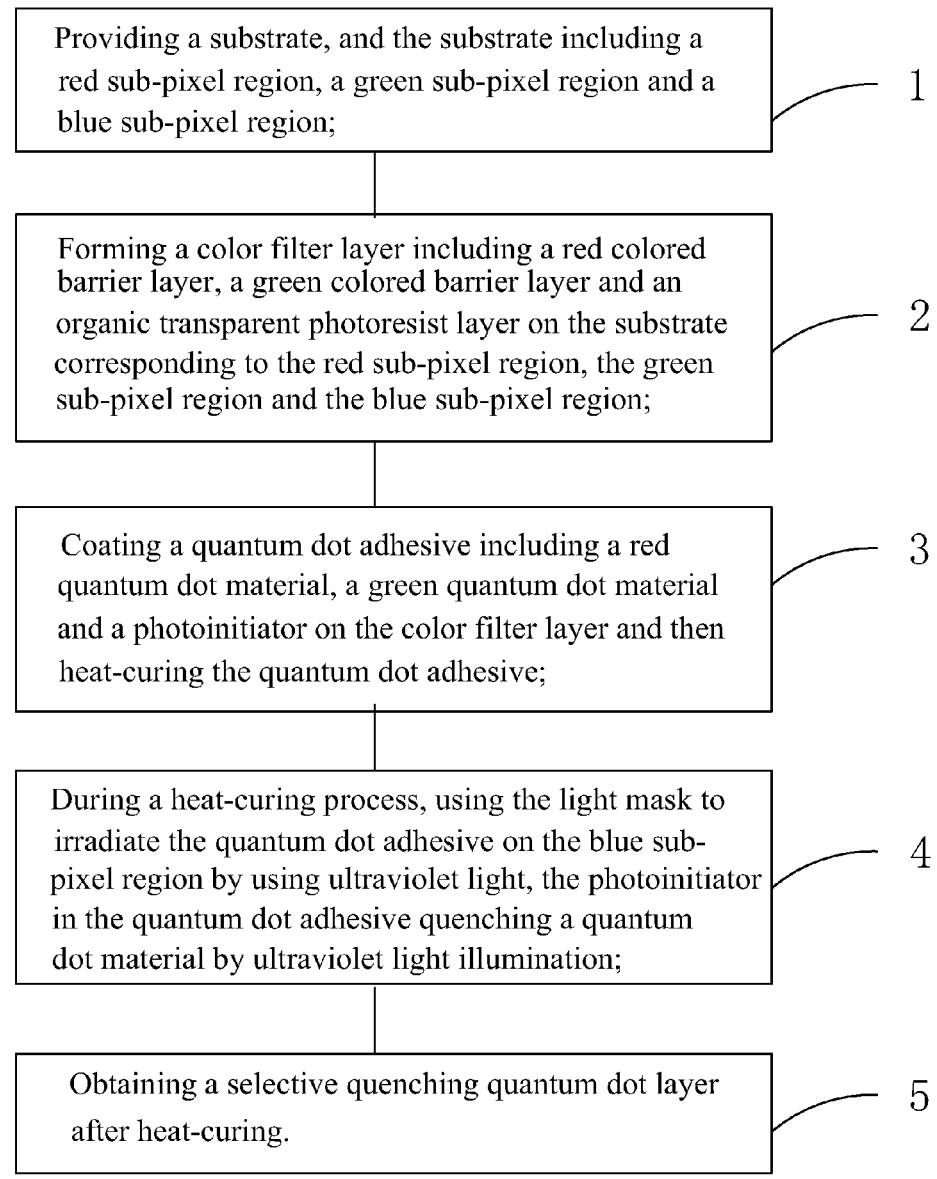
FIG. 1 is a schematic flow quantum dot color film substrate preparation process according to the present disclosure.

Refer to FIG. 1, the present disclosure first provides a method for manufacturing quantum dot color film substrate includes the following steps:

Step 1, a substrate 10 is provided. The substrate 10 including a red sub-pixel region, a green sub-pixel region and a blue sub-pixel region;

Step 2, a patterned red colored barrier layer 21, a patterned green colored barrier layer 22 and a patterned organic transparent photoresist layer 23 is formed on the substrate 10 corresponding to the red sub-pixel region, the green sub-pixel region and the blue sub-pixel region to obtain a color filter layer 20 including a red colored barrier layer 21, a green colored barrier layer 22 and an organic transparent photoresist layer 23;

Step 3, a thickness of 0.5-20 µm quantum dot adhesive is coated on the color filter layer 20 and then heat-curing the quantum dot adhesive is heat-cured;

The quantum dot adhesive is a thermosetting adhesive, including a red quantum dot material, a green quantum dot material and a photoinitiator; the photoinitiator is a UV-initiator capable of quenching the quantum dot material by UV irradiation;

specifically, the quantum dot material in the quantum dot adhesive is group II-VI quantum dot material and one or more of group quantum dot material in one or more; preferably. The quantum dot material in the quantum dot adhesive is ZnCdSe2, CdSe, CdTe, CuInS2 and one or more of ZnCuInS3 in one or more.

Specifically, the photoinitiator itself does not influence fluorescence properties of quantum dot, but the photoinitiator can quenching quantum dot material directly by generated high-activity radicals after UV irradiation; preferably, the photoinitiator is benzoin dimethyl ether (BDK) or benzoyl methyl formate (MBF).

Wherein, a principle of photoinitiator quenching quantum dot fluorescent, as an example by the benzoin dimethyl ether, the benzoin dimethyl is a common ultraviolet ray initiator, an equation of photo-cleavage reaction can be expressed as follows:

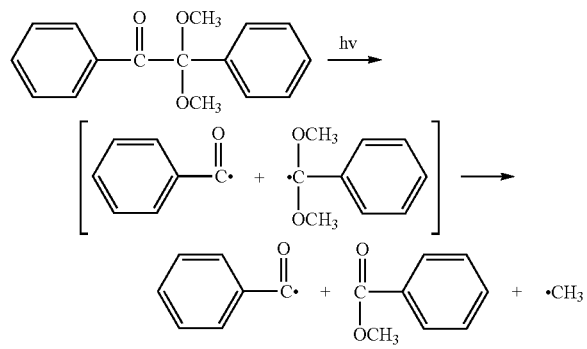

The benzoin dimethyl ether is widely applied in polymerization of unsaturated monomers acrylate, methacrylate, acrylonitrile, acrylamide, styrene, Maleic acid, fumarate, and mixtures thereof. Also, it is widely applied in polymerization and crosslink of unsaturated monomers and oligomer of polyvinyl alcohol and polyester. The photoinitiator in the absence of UV irradiation is very stable and itself not being affected by quantum dot illumination, but carbonyl radicals and methyl radicals have very high reaction activity, the presence of free radicals can affect recombination process of the quantum dot material excited electron and hole to quench quantum dot fluorescence.

Figure 2:
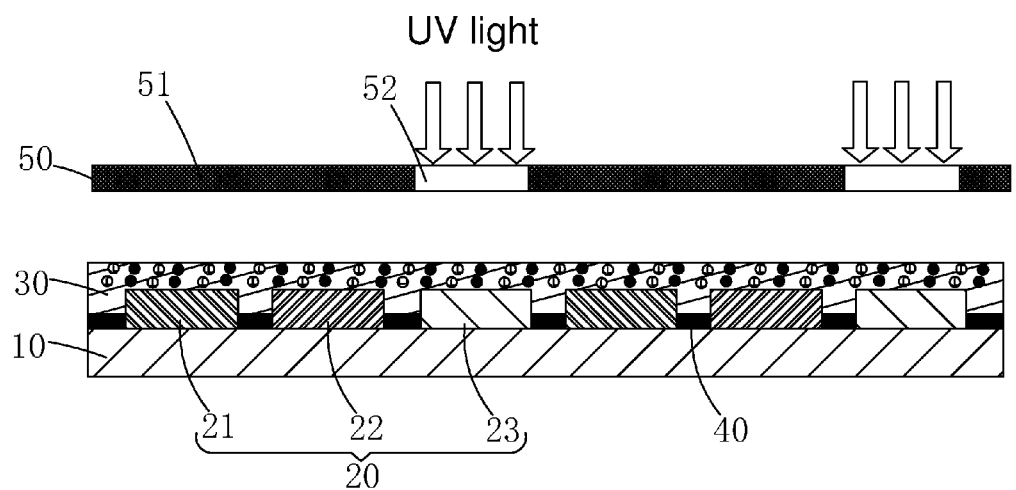
FIG. 2 is a schematic diagram of the step 4 of the quantum dot color film substrate preparation process according to the present disclosure.

In step 4, as shown in FIG. 2, a light mask 50 is provided during a heat-curing process (longer time of the general heat-curing process for longer several hours) The light mask 50 includes a non-transmitting portion 51 corresponding to the red sub-pixel region and the green sub-pixel region, and a transmitting portion 52 corresponding to the blue sub-pixel region. The light mask 50 is used to irradiate the quantum dot adhesive on the blue sub-pixel region by the ultraviolet light. The photoinitiator in the quantum dot adhesive on the blue sub-pixel region quenches a quantum dot material under ultraviolet light illumination, but the quantum dot material in the quantum dot adhesive on the red sub-pixel region and the green sub-pixel region is not affected by ultraviolet light illumination;

In step 5, a selective quenching quantum dot layer 30 is obtained after heat-curing; and the quantum dot layer 30 includes a first quantum dot layer 31 on the red sub-pixel region and the green sub-pixel region and a second quantum dot layer 32 on the blue sub-pixel region. The first quantum dot layer 31 is capable of emitting red and green light under excitation of blue light. A quantum dot material in the second quantum dot layer 32 does not emit light under backlight illumination because the photoinitiator is quenched fluorescence by ultraviolet light illumination in the step 4;

when the quantum dot color film substrate is used in a blue backlight display device to display, the red and green mixed light from the first quantum dot layer 31 is filtered by through the red colored barrier layer 21 and green colored barrier layer 22. A blue light backlight emits blue light through the second quantum dot layer 32 and the organic transparent photoresist layer 23, therefore the color display is achieved and index of gamut is improved effectively. Also, the quantum dot layer 30 does not include blue quantum dot material. The blue light backlight matches with the organic transparent photoresist layer, when the light utilization is improved and the material cost is reduced at the same time.

After step 5, the first quantum dot layer 31 has I uniform distribution of photoinitiator. The photochemical reaction of photoinitiator will be largely suppressed after curing treatment. In order to ensure the quantum dot material in the first quantum dot layer 31 be illuminated stable, the present disclosure further comprises step 6, where a filter layer is formed on the first quantum dot layer 31 to filter out blue light below 400 nm wavelength, for preventing the photoinitiator in the first quantum dot layer 31 on quenching the quantum dot material by ultraviolet illumination.

The selective quenching mechanism of the present disclosure is to form a quantum dot adhesive by mixing a red quantum dot material, a green quantum dot material and a photoinitiator in a thermosetting adhesive. The photoinitiator does not destroy fluorescence properties of quantum dot. But after UV irradiation. The cleaved photoinitiator generates high negative free radicals with strong electron withdrawing ability to capture excited electron. The electron cannot recombine with holes but results in quenching quantum dot fluorescence. A selective quenching quantum dot layer is obtained after coating a quantum dot adhesive uniformly on a color filter layer. The light mask is used to irradiate the quantum dot adhesive on the blue sub-pixel region, free radicals is generated by cleaving a photoinitiator and is quenching the quantum dot material directly.

The method for manufacturing quantum dot color film substrate of the present disclosure uses a thermosetting adhesive composed of simple to disperse a quantum dot material and a photoinitiator, to reduce quantum dot material illumination interference from chemical environment surrounding the quantum dot material, resulted the selective quenching by photoinitiator, when high gamut is obtained and the manufacturing process is be simplified at the same time.

Figure 3:
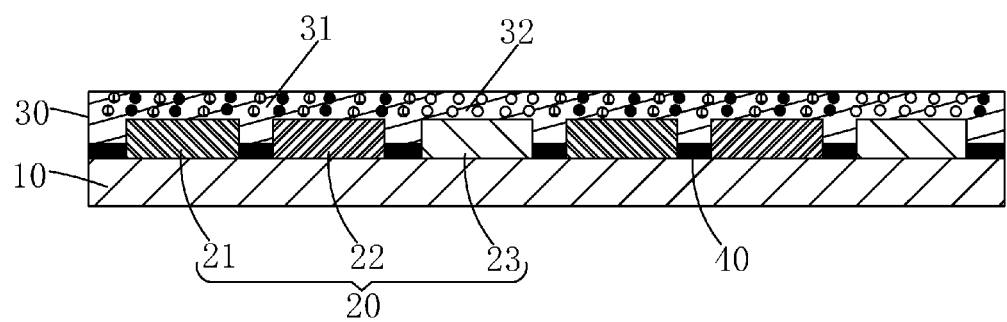
FIG. 3 is a cross-section of the quantum dot color film substrate structure diagram.

As shown in FIG. 3, the present disclosure further provides a quantum dot color film substrate including a substrate 10, a color filter layer 20 on the substrate 10 and a quantum dot layer 30 on the color filter layer 20;

The substrate 10 includes a red sub-pixel region, a green sub-pixel region and blue sub-pixel region; and the color filter layer 20 includes a red colored barrier layer 21, a green colored barrier layer 22 and an organic transparent photoresist layer 23 corresponding to the red sub-pixel region, the green sub-pixel region and the blue sub-pixel region;

The quantum dot layer 30 includes a first quantum dot layer 31 on the red sub-pixel region and the green sub-pixel region and a second quantum dot layer 32 on the blue sub-pixel region; the quantum dot layer 30 is formed by a quantum dot adhesive; the quantum dot adhesive is formed by mixing a red quantum dot material, a green quantum dot material and a photoinitiator in a thermosetting adhesive; the first quantum dot layer is excited to emitting red light and green light by light; the quantum dot material in the second quantum dot layer 32 is fluorescence quenched by the photoinitiator under UV irradiation. The second quantum dot layer 32 does not emit exciting light;

The quantum dot color film substrate is used in a blue backlight display device. Specifically, the quantum dot color film substrate can be used in a liquid crystal display device, an organic light-emitting display device or a quantum dot light emitting display device.

Specifically, thickness of the quantum dot layer 30 is 0.5-20 μm; when backlight illumination, a red quantum dot material in the first quantum dot layer 31 excites red light which wavelength range of 630-690 nm under blue light backlight. A green quantum dot material in the first quantum dot layer 31 excites green light wavelength range of 500-560 nm under blue light backlight. A quantum dot material of the second quantum dot layer 32 is a quenching fluorescence quantum dot material, and therefore the backlight module does not emit light under backlight irradiation. When the quantum dot color film substrate is used in a blue backlight display device to display, the red and green mixed light from the first quantum dot layer 31 filters out red and green through the red colored barrier layer 21 and green colored barrier layer 22, a blue light backlight emits blue light through the second quantum dot layer 32 and the organic transparent photoresist layer 23, therefore the color display is achieved and index of gamut can be effectively improved. Also, the quantum dot layer 30 does not include blue quantum dot material, and the blue light backlight matches with organic transparent photoresist layer, when the light utilization is improved and the material cost is reduced.

To ensure a quantum dot material in the first quantum dot layer 31 steady illumination, the first quantum dot layer 31 further arranged a filter layer to filter out light below 400 nm wavelength, for preventing the photoinitiator in the first quantum dot layer 31 quenches the quantum dot material by ultraviolet illumination.

Specifically, the quantum dot color film substrate further comprises a black matrix 40 on the substrate 10.

Specifically, the quantum dot material in the quantum dot adhesive is group II-VI quantum dot material and one or more of group quantum dot material in one or more; preferably, the quantum dot material in the quantum dot adhesive is ZnCdSe2, CdSe, CdTe, CuInS2 and one or more of ZnCuInS3 in one or more.

Specifically, the photoinitiator does not influence fluorescence properties of quantum dot, but the photoinitiator can quench quantum dot material generated directly by high-activity radicals after UV irradiation. Preferably, the photoinitiator is benzoin dimethyl ether (BDK) or benzoyl methyl formate (MBF).

In summary, the method for manufacturing quantum dot color film substrate of the present disclosure forms a quantum dot adhesive by mixing a red quantum dot material, a green quantum dot material and a photoinitiator in a thermosetting adhesive, the photoinitiator itself does not destroy fluorescence properties of quantum dot, but the photoinitiator is cleaved and can quench the fluorescence of quantum dot after UV irradiation. A selective quenching quantum dot layer is obtained after coating a quantum dot adhesive uniformly on a color filter layer, and the light mask is used to irradiate the quantum dot adhesive on the blue sub-pixel region. Free radicals is generated by cleaving a photoinitiator and is quenching the quantum dot material directly. The quantum dot color film substrate by the preparation process capable of meeting requirement of high gamut, simple preparation process and low cost. The quantum dot color film substrate of the present disclosure includes a selective quenching quantum dot layer to improve the gamut of display device effectively, to simplify preparation process and to reduce cost.

Described above, those of ordinary skill in the art that may be made various other changes and modifications in accordance with the appropriate technical solutions and the technical concept of the present invention, and all such changes and modifications should belong to the protection of the present invention range.

What is claimed is:

1. A method for manufacturing quantum dot color film substrate comprises the following steps:
   Step 1, providing a substrate, and the substrate comprising a red sub-pixel region, a green sub-pixel region and a blue sub-pixel region;
   Step 2, forming a patterned red colored barrier layer, a patterned green colored barrier layer and a patterned organic transparent photoresist layer on the substrate corresponding to the red sub-pixel region, the green sub-pixel region and the blue sub-pixel region to obtain a color filter layer comprising a red colored barrier layer, a green colored barrier layer and an organic transparent photoresist layer;
   Step 3, coating a quantum dot adhesive on the color filter layer and then heat-curing the quantum dot adhesive;
   the quantum dot adhesive is a thermosetting adhesive, comprising a red quantum dot material, green quantum dot material and a photoinitiator; the photoinitiator is a UV-initiator capable of quenching quantum dot material by UV irradiation;
   Step 4, providing a light mask during a heat-curing process, the light mask comprises a non-transmitting portion corresponding to the red sub-pixel region and the green sub-pixel region, a transmitting portion corresponding to the blue sub-pixel region; using the light mask to irradiate the quantum dot adhesive on the blue sub-pixel region by using ultraviolet light, the photoinitiator in the quantum dot adhesive on the blue sub-pixel region quenching a quantum dot material by ultraviolet light illumination, but the quantum dot material in the quantum dot adhesive on the red sub-pixel region and the green sub-pixel region not being affected by ultraviolet light illumination;
   Step 5, obtaining a selective quenching quantum dot layer after heat-curing; resulting in a color film substrate comprising a substrate, a color filter and a quantum dot layer; the quantum dot layer comprising a first quantum dot layer on the red sub-pixel region and the green sub-pixel region and a second quantum dot layer on the blue sub-pixel region;
   a red quantum dot material and a green quantum dot material in the first quantum dot layer capable of emitting red and green light under excitation of blue light; a quantum dot material in the second quantum dot layer does not emit light under illumination.

2. The method for manufacturing quantum dot color film substrate according to claim 1, wherein the photoinitiator is benzoin dimethyl ether or benzoyl methyl formate.

3. The method for manufacturing quantum dot color film substrate according to claim 1, wherein in the step 3, thickness of the quantum dot adhesive coated on the color filter layer is 0.5-20 μm.

4. The method for manufacturing quantum dot color film substrate according to claim 1, further comprising step 6, a filter layer is formed on the first quantum dot layer to filter out blue light below 400 nm wavelength, for preventing the photoinitiator in the first quantum dot layer quenches the quantum dot material by ultraviolet illumination.

5. The method for manufacturing quantum dot color film substrate according to claim 1, wherein the quantum dot material in the quantum dot adhesive is group II-VI quantum dot material and one or more of group I-III-VI quantum dot material in one or more.

6. The method for manufacturing quantum dot color film substrate according to claim 5, wherein the quantum dot material in the quantum dot adhesive is $ZnCdSe_2$, CdSe, CdTe, $CuInS_2$ and one or more of $ZnCuInS_3$ in one or more.

\* \* \* \* \*